United States Patent
Mayer et al.

(10) Patent No.: US 12,075,584 B2
(45) Date of Patent: Aug. 27, 2024

(54) ELECTRICAL DEVICE, E.G., A CONVERTER MOTOR, HAVING A HOUSING PART AND A COVER PART

(71) Applicant: SEW-EURODRIVE GMBH & CO. KG, Bruchsal (DE)

(72) Inventors: Ralph Mayer, Ubstadt-Weiher (DE); Franz Daminger, Ludwigshafen am Rhein (DE)

(73) Assignee: SEW-EURODRIVE GMBH & CO. KG, Bruchsal (DE)

( * ) Notice: Subject to any disclaimer, the term of this patent is extended or adjusted under 35 U.S.C. 154(b) by 369 days.

(21) Appl. No.: 17/601,099

(22) PCT Filed: Mar. 9, 2020

(86) PCT No.: PCT/EP2020/025118
§ 371 (c)(1),
(2) Date: Oct. 4, 2021

(87) PCT Pub. No.: WO2020/200515
PCT Pub. Date: Oct. 8, 2020

(65) Prior Publication Data
US 2022/0167518 A1    May 26, 2022

(30) Foreign Application Priority Data
Apr. 4, 2019 (DE) .......................... 102019002462.1

(51) Int. Cl.
*H05K 5/06* (2006.01)
*H05K 7/14* (2006.01)

(52) U.S. Cl.
CPC .................................. *H05K 5/061* (2013.01)

(58) Field of Classification Search
CPC ............ H05K 5/061; H05K 5/03; H05K 5/06; H05K 7/1432; B60R 16/0239
See application file for complete search history.

(56) References Cited

U.S. PATENT DOCUMENTS 10,493,391 B2   12/2019  Luley
10,588,248 B1*   3/2020  Falslev ............... H05K 9/0081
(Continued)

FOREIGN PATENT DOCUMENTS

CN    107261687 A    10/2017
CN    108574064 A     9/2018
(Continued)

OTHER PUBLICATIONS

International Search Report issued in corresponding International Application No. PCT/EP2020/025118, dated May 20, 2020, pp. 1-2, English Translation.

*Primary Examiner* — Hoa C Nguyen
*Assistant Examiner* — Amol H Patel
(74) *Attorney, Agent, or Firm* — Carter, DeLuca & Farrell LLP

(57) ABSTRACT

An electrical device, e.g., a converter motor, includes a housing part and a cover part. A frame part is positioned between the housing part and the cover part, and an electronic circuit is situated in the interior space surrounded by the housing that includes the housing part and the cover part, e.g., and the frame part. A seal is situated, e.g., injection-molded, on the frame part. For example, the seal touches both a connection surface, e.g., a planar connection surface arranged on the cover part, and it covers a connection surface, e.g., a planar connection surface arranged on the housing part. A region of the connection surface of the cover part touches the frame part, and a region of the connection surface of the housing part touches the frame part.

28 Claims, 5 Drawing Sheets

(56) References Cited

U.S. PATENT DOCUMENTS

| | | | |
|---|---|---|---|
| 10,707,461 B2 | 7/2020 | Kellner | |
| 2013/0292383 A1* | 11/2013 | Mullaney | H05K 5/062 |
| | | | 277/654 |
| 2016/0057878 A1* | 2/2016 | Su | G06F 1/1656 |
| | | | 361/752 |
| 2017/0196110 A1* | 7/2017 | Shinn | F16J 15/022 |
| 2019/0120455 A1* | 4/2019 | Badia | F21S 45/47 |
| 2020/0253072 A1* | 8/2020 | Peng | H05K 5/061 |
| 2021/0251094 A1* | 8/2021 | Okamoto | H05K 5/062 |

FOREIGN PATENT DOCUMENTS

| | | |
|---|---|---|
| DE | 102004038690 A1 | 2/2006 |
| DE | 102013112096 A1 | 5/2015 |
| WO | 2018224217 A1 | 12/2018 |

\* cited by examiner

ELECTRICAL DEVICE, E.G., A CONVERTER MOTOR, HAVING A HOUSING PART AND A COVER PART

FIELD OF THE INVENTION

The present invention relates to an electrical device, e.g., a converter motor, having a housing part and a cover part.

BACKGROUND INFORMATION

In certain conventional arrangements, a housing can be implemented with a high degree of protection with the aid of seals.

SUMMARY

Example embodiments of the present invention provide an electrical device in an uncomplicated manner and with a high degree of protection.

According to an example embodiment of the present invention, an electrical device, e.g., a converter motor, includes a housing part, a cover part, and a frame part arranged between the housing part and the cover part. An electronic circuit is situated in the inner space surrounded by the housing, which includes, for example, the housing part and the cover part, and the frame part. A seal is situated on the frame part, e.g., injection-molded onto the frame part, and the seal touches both a connection surface, e.g., a planar connection surface, arranged on the cover part and thus provides sealing between the frame part and the cover part, and it touches a connection surface, e.g., a planar connection surface, arranged on the housing part and thus provides sealing between the frame part and the housing part. A region of the connection surface of the cover part touches the frame part, and a region of the connection surface of the housing part touches the frame part.

This offers the advantage that the frame part provides a seal which is situated between the housing part and the cover part, and the cover part is therefore connectable to the housing part in a tight manner. To this end, the seal is retained by the frame part in an integral fashion. This allows for a precise positioning during the assembly. For example, the housing part includes positioning device(s) for this purpose such as pins, which project into a recess of the frame part. In addition, the cover part and the housing part simply have to provide a planar surface on which the seal exerts pressure and thus seals in the process. The connection surfaces are finely machined.

According to example embodiments, the seal surrounds the outer edge region of the frame part when viewed from the direction of the interior space. For example, a first region of the seal is situated on the side of the frame part facing the cover part, and a second region of the seal is situated on the side of the frame part facing the housing part. This has the advantage that the seal extends in one piece from a first side of the frame part facing the cover part to a second side of the housing part facing the housing part. This makes it possible to achieve uninterrupted sealing. This is because the frame part is not directly involved in the sealing function but merely retains the seal and specifies a defined deformation path for the deformation of the seal.

According to example embodiments, a screw that extends through the cover part and through the frame part is screwed into a threaded bore situated in the housing part, the screw head of the screw pressing the cover part toward the housing part so that the cover part touches the frame part, and the frame part touches the housing part, e.g., on the side of the frame part facing away from the cover part. This offers the advantage that the housing part and the cover part are able to be screw-fitted with the frame part until contact is established, that is to say, until complete contact is reached between the respective connection surfaces and the frame part. The penetration depth of the screw and also the deformation of the seal thus is restricted by the frame part. However, because the seal slightly protrudes, it is deformed only to such an extent that the connection surfaces rest flatly against the frame part.

According to example embodiments, the frame part is made from metal and the seal is made from a plastic material and/or rubber. This offers the advantage of providing an uncomplicated and economical production, and the frame part has a robust configuration and the seals are elastically deformable.

According to example embodiments, the frame part has a substantially rectangular configuration. This offers the advantage that the interior space surrounds a large volume and a rectangular circuit board on which the electronics of a converter can be fitted is able to be accommodated. An optimal space utilization is therefore possible between the circuit board and frame part.

According to example embodiments, the frame part has tab regions, e.g., tab regions in the shape of a clip, which are retained in a positively-engaged manner on, e.g., clipped into, lug regions arranged on the housing part, e.g., lug regions that are premolded on the inner wall of the housing so as to protrude into the interior space. This offers the advantage that the lug regions can be clipped into the tab regions, and the frame part is thereby able to be positioned and connected to the housing part. When the cover part is placed on top, the frame part is therefore already positioned on the housing part.

According to example embodiments, the respective lug region has a lead-in bevel, and the lug region, for example, protrudes to an increasing extent into the interior space in the direction of the screw axis of the screw. For example, the lug region behind the lead-in bevel protrudes into the interior space to a lesser extent than in the lug region. This offers the advantage that when the frame part is positioned, the tab regions are elastically deflected into the interior space to an increasing extent until the tab regions snap into place in the lug region.

According to example embodiments, the respective lug region is arranged as a thickening of the wall of the housing part. This has the advantage that the wall has greater stability and the lug region is able to be produced in an uncomplicated and economical manner, and, for example, may receive its primary form during the casting process.

According to example embodiments, the threaded bore is provided in a thickening of the wall of the housing part, the thickening, for example, being set apart from the lug regions and protruding into the interior space. This offers the advantage that the frame part has greater stability and no extra work is required to produce the threaded bore. The thickening may thus already be taken into account during the primary shaping.

According to example embodiments, the connection surfaces are aligned in parallel with a plane whose normal extends parallel to the direction of the screw axis of the screw.

According to example embodiments, the tab regions on the frame part are bent, e.g., from a plane extending in parallel with the plane, in the direction of the screw axis. This offers the advantage that the frame part is able to be produced from sheet metal as a punched and bent part. Greater stability is therefore achievable in an uncomplicated manner. Moreover, because of the downward bending of the tab regions, a deflection of the tab region perpendicular to the placement direction is achievable and thus a clip-in connection, that is to say, a positive engagement that is effective in the placement direction.

According to example embodiments, the frame part has a recess, e.g., a recess which is continuous in the screw axis direction of the screw, into which a pin protrudes which is arranged on the housing part. The pin, for example, is arranged in a thickening of the wall of the housing part, the thickening, for example, being set apart from the lug regions and protruding into the interior space. This offers the advantage that a precise positioning is able to be achieved without any special effort. A rough positioning is achievable with the aid of the tab regions when the tab regions are clipped into the lug regions, while a precise positioning is additionally achievable with the aid of the pins.

According to example embodiments, the underside of the housing part has a recess, and the housing part is situated on a shoulder of a terminal box of an electric motor. Stator lines of the stator of the electric motor are guided through the recess into the interior space surrounded by the housing, and a converter is situated in the interior space, for example. This has the advantage that the housing part is able to be placed on an electric motor. An electrical device may therefore be arranged in an integrated fashion on the electric motor and used in the field because the housing is sealed with the aid of the frame part.

According to example embodiments, the seal is arranged as a composite part together with the frame part. This offers the advantage of achieving an uncomplicated production.

According to example embodiments, on the side of the frame part facing the cover part, the seal has a first sealing lip, which is circumferentially arranged on the frame part and elastically deformed more heavily than the rest of the material of the seal on the side of the frame part facing the cover part. On the side of the frame part facing the housing part, the seal has a second sealing lip which is circumferentially arranged on the frame part and is elastically deformed more heavily than the rest of the material of the seal on the side of the frame part facing the housing part. This has the advantage that great tightness, i.e., a high degree of protection, is achievable in a simple and cost-effective manner.

According to example embodiments, the screw projects through a hole which is situated in the frame part and sealed by the seal from the interior space and the environment on each one of the two connection surfaces, i.e., for example, on both sides on the frame part. This offers the advantage that a high degree of protection is achievable and the screw is able to be protected against corrosion.

According to example embodiments, the first sealing lip completely surrounds the screw in the first of the two connection surfaces, and thus especially provides sealing from the interior space and the external environment. The second sealing lip completely surrounds the screw in the second of the two connection surfaces, and thus especially provides sealing from the interior space and the external environment. This offers the advantage that the screw is protected against corrosion.

Further features and aspects of example embodiments of the present invention are described in greater detail below with reference to the appended schematic Figures.

DETAILED DESCRIPTION

Figure 1:
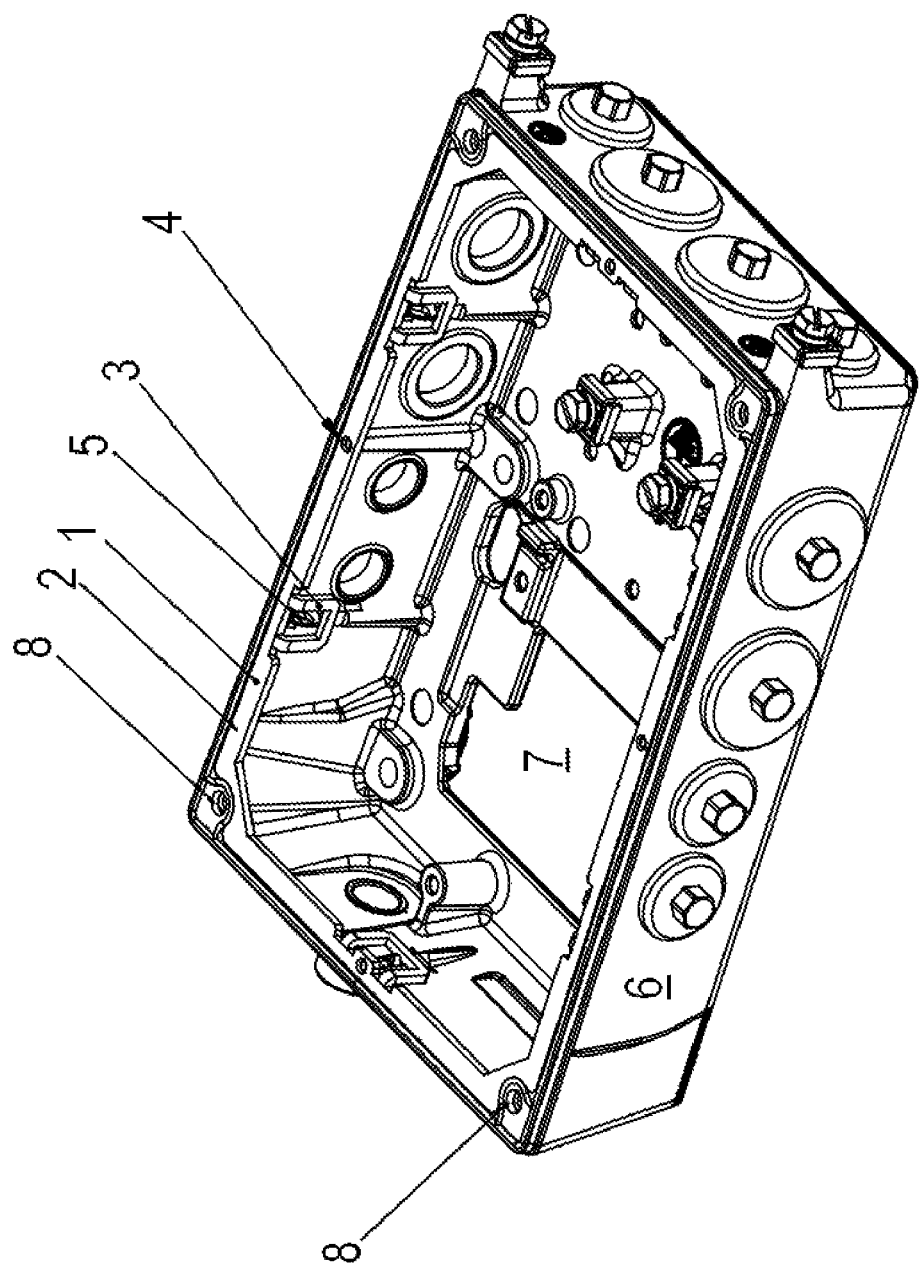
FIG. 1 is a schematic perspective view of a housing part 6 with a frame part 1 positioned thereon.
Figure 2:
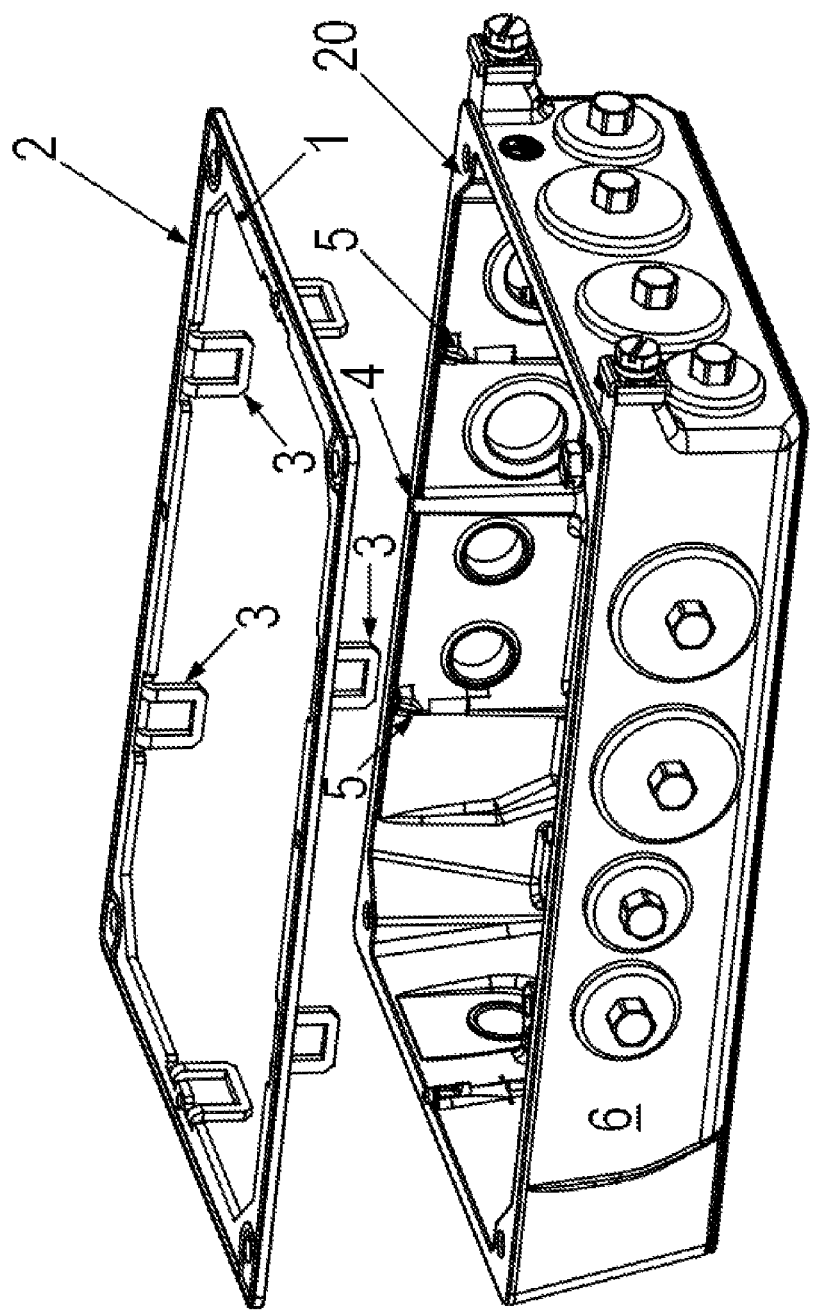
FIG. 2 is a schematic perspective, exploded view of a frame part 1 and housing part 6.
Figure 3:
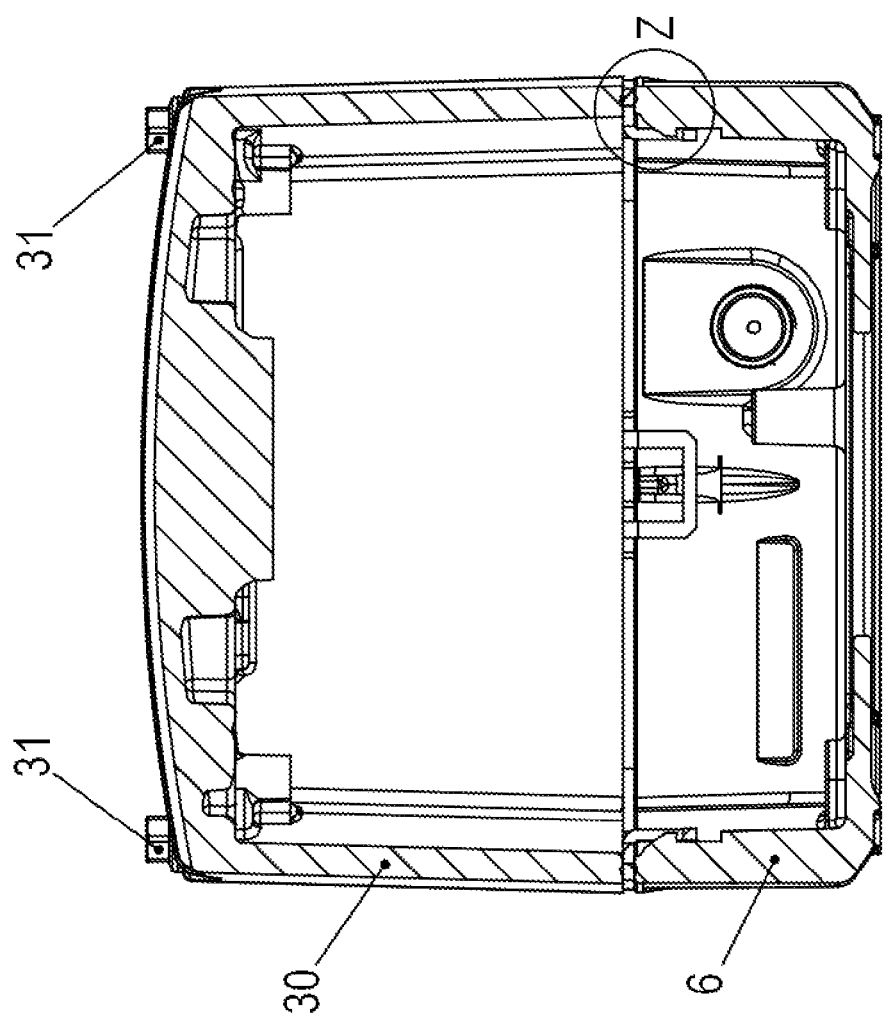
FIG. 3 is a schematic cross-sectional view through a housing that is formed by housing part 6 with cover part 30 placed on frame part 1.

As schematically illustrated in the Figures, the housing part has a recess 7 on its underside so that the housing is able to be placed on a shoulder of a terminal box of an electric motor and the stator lines are able to be guided through recess 7 into the interior space surrounded by the housing.

An electronic circuit, which may be arranged as a converter for feeding the electric motor, is able to be placed inside the housing. As a whole, the converter together with the housing and electric motor thus makes up a converter motor.

As an alternative, however, the housing may also be placed in a decentralized manner, i.e., separately from the electric motor in a system. To this end, housing part 6 is attached to a support part or a device with the aid of screws.

Frame part 1, which includes an injection-molded seal 2, is able to be placed between cover part 30 and housing part 6. Thus, cover part 30 is tightly connectable to housing part 6. This is because frame part 1 has a wall thickness that is thinner than the wall thickness of seal 2. In addition, seal 2 is placed at the outer edge of frame part 1. When screws 31 are screwed into threaded bores introduced into housing part 6, cover part 30 is therefore pressed via a planar connection surface against frame part 1, which in turn exerts pressure on a planar connection surface of housing part 6.

In the process, seal 2 is elastically compressed and thus rests tightly against the two connection surfaces.

Seal 2 has a greater wall thickness, but not along the entire connection surface to cover part 30 and to housing part 6; instead, seal 2 has a circumferential sealing lip at the outer edge of frame part 1, which protrudes from the rest of the material of seal 2. A particularly high surface pressure of seal 2 is therefore achievable, which consequently also means that a high degree of protection is able to be induced.

Figure 4:
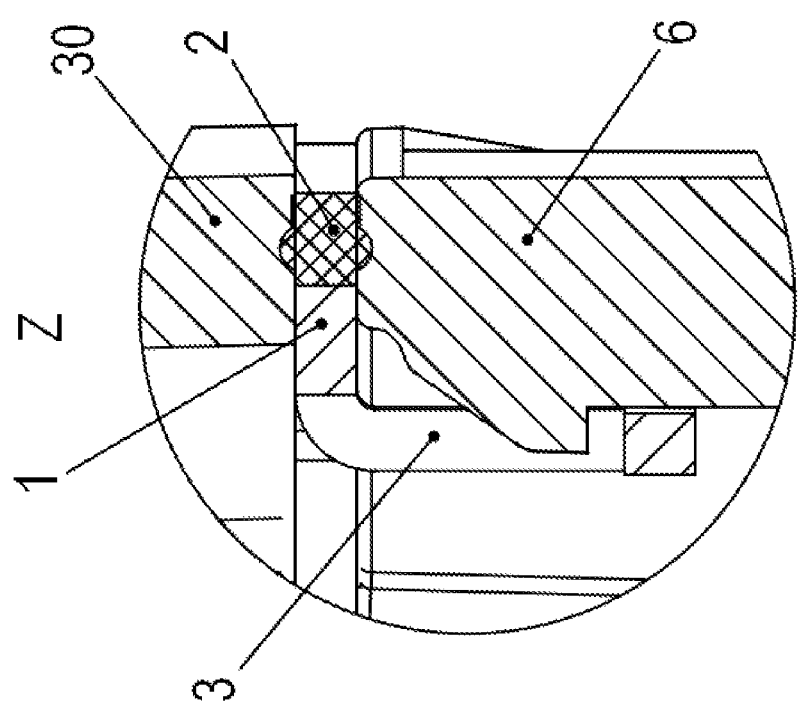
FIG. 4 is an enlarged schematic view of a portion of FIG. 3.
Figure 5:
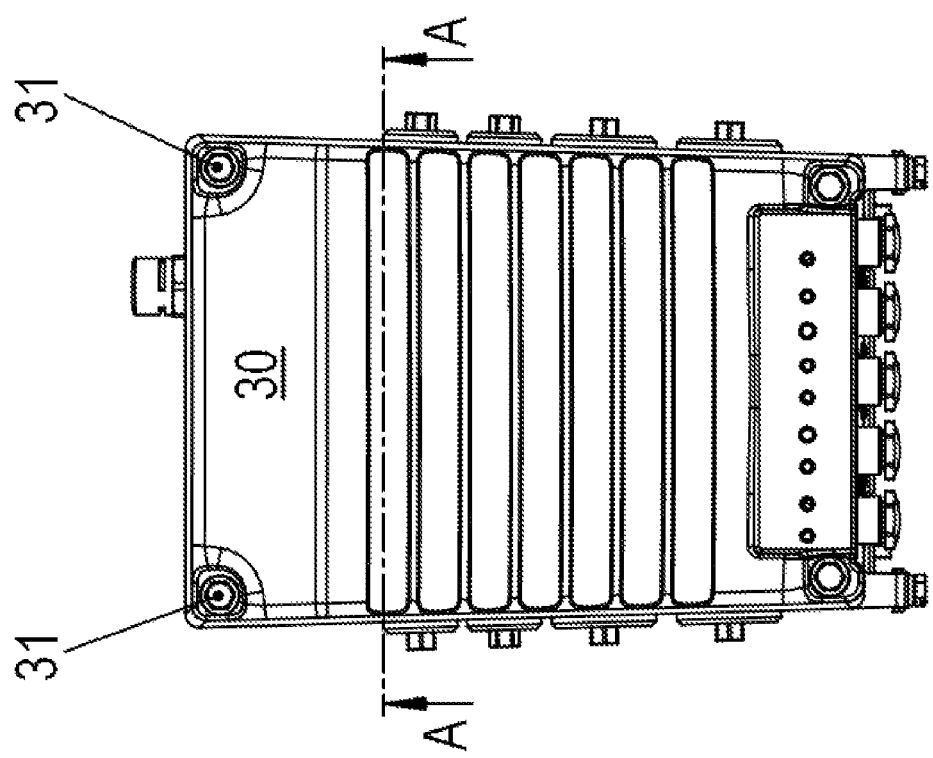
FIG. 5 is a schematic top view of the housing.

FIG. 4 shows seal 2 in an undeformed state, although cover part 30 and housing part 6 rest against frame part 1. The protruding region of seal 2 illustrated is the region that is deformed during the actual connecting. High surface pressure is therefore exerted on seal 2.

Frame part 1 has tab regions 3, which are set apart from one another and clipped into lug regions 5 that protrude on housing part 6.

Tab regions 3 are bent off frame part 1 by approximately 90° and thus extend perpendicular to the connection surfaces.

Lug regions 5 project in the direction of the interior space and have a lead-in bevel so that when frame part 1 is placed on housing part 6, the tab region is guided along the lead-in bevel and initially is elastically deflected to an increasing extent into the interior space region surrounded by housing part 6. Once the point of the respective lug region 5 maximally projecting into the interior space is exceeded, respective tab region 3 snaps into place in a depression or recess behind respective lug region 5.

In addition, frame part 1 is provided with recesses, e.g., round holes, into which pins premolded on housing part 6 protrude so that frame part 1 is positioned and/or centered in relation to housing part 6.

The respective pin 4 is provided on a bar, which is implemented as a thickened region of the wall thickness of housing part 6.

In the same manner, lug region 5 is arranged as a thickened region of the wall thickness of housing part 6.

The sealing lip of seal 2 circumferential along the outer edge of frame part 1 extends in two parts in the region of respective threaded bore 8. The sealing lip in this region is thus split into an inner part that faces toward the interior space and an outer part that faces away from the interior space.

Thus, the mouth of respective threaded bore 8 is surrounded by the sealing lip on both sides when viewed from the direction of the interior space, and it is thus completely sealed, e.g., in all directions of the connection surface, once cover part 30 is placed on top.

In further exemplary embodiments, frame part 1 is produced from the same material as housing part 6 and cover part 30, e.g., aluminum. As a result, no interruptions in the sealing system are able to be induced even in the presence of thermal changes.

In further exemplary embodiments, the housing is used to enclose a different electronic circuit. The housing consequently is arranged as a housing for an electrical device.

LIST OF REFERENCE NUMERALS

1 frame part, e.g., metallic frame part
2 seal
3 tab region of frame part 1
4 pin
5 lug region
6 housing part
7 recess
8 threaded bore
30 cover part
31 screws

The invention claimed is:

1. An electrical device, comprising:
a housing part;
a cover part;
a frame part arranged between the housing part and the cover part;
an electronic circuit arranged in an interior space surrounded by a housing that includes the housing part, the cover part, and the frame part; and
a seal arranged on the frame part;
wherein the seal touches a connection surface of the cover part and provides a seal between the frame part and the cover part;
wherein the seal touches a connection surface of the housing part and provides a seal between the frame part and the housing part;
wherein a region of the connection surface of the cover part touches the frame part;
wherein a region of the connection surface of the housing part touches the frame part; and
wherein the frame part has a recess, and the housing part includes a pin that protrudes into the recess.

2. The electrical device according to claim 1, wherein the electrical device is arranged as a converter motor.

3. The electrical device according to claim 1, wherein the seal is injection-molded on the frame part.

4. The electrical device according to claim 1, wherein the connection surface arranged on the cover part and/or the connection surface arranged on the housing part is arranged as a planar connection surface.

5. The electrical device according to claim 1, wherein the seal surrounds an outer edge region of the frame part when viewed from a direction of the interior space.

6. The electrical device according to claim 1, wherein a first region of the seal is arranged on a side of the frame part facing the cover part, and a second region of the seal is arranged on a side of the frame part facing the housing part.

7. The electrical device according to claim 1, wherein a screw that extends through the cover part and through the frame part is screwed into a threaded bore arranged in the housing part, a screw head of the screw presses the cover part toward the housing part so that the cover part touches the frame part and the frame part touches the housing part.

8. The electrical device according to claim 7, wherein the screw head of the screw presses the cover part toward the housing part so that the cover part touches the frame part and the frame part touches the housing part on a side of the frame part facing away from the cover part.

9. The electrical device according to claim 7, wherein the threaded bore is arranged in a thickening of a wall of the housing part.

10. The electrical device according to claim 7, wherein the connection surfaces are aligned in parallel with a plane having a normal that is parallel to a direction of a screw axis of the screw.

11. The electrical device according to claim 7, wherein the screw projects through a hole arranged in the frame part and is sealed by the seal on each connection surface, on both sides on the frame part, from the interior space and the environment.

12. The electrical device according to claim 1, wherein the frame part is formed of metal and the seal formed of a plastic material and/or rubber.

13. The electrical device according to claim 1, wherein the frame part is substantially rectangular.

14. The electrical device according to claim 1, wherein the pin protrudes into the recess to position and/or center the frame relative to the housing part.

15. The electrical device according to claim 1, wherein the recess is continuous in a direction of a screw axis of a screw, the pin is arranged as a thickening of a wall of the housing part, and the thickening is set apart from lug regions and protrudes into the interior space.

16. The electrical device according to claim 1, wherein the seal is arranged as a composite part together with the frame part.

17. An electrical device, comprising:
a housing part;
a cover part;
a frame part arranged between the housing part and the cover part;
an electronic circuit arranged in an interior space surrounded by a housing that includes the housing part, the cover part, and the frame part; and
a seal arranged on the frame part;
wherein the seal touches a connection surface of the cover part and provides a seal between the frame part and the cover part;
wherein the seal touches a connection surface of the housing part and provides a seal between the frame part and the housing part;
wherein a region of the connection surface of the cover part touches the frame part;

wherein a region of the connection surface of the housing part touches the frame part; and wherein the frame part includes tab regions and/or clip-shaped tab regions retained in a positively-engaged manner on and/or clipped to lug regions arranged on the housing part and/or premolded on an inner wall of the housing part that protrude into the interior space.

18. The electrical device according to claim 17, wherein each lug region includes a lead-in bevel and/or protrudes to an increasing extent into the interior space in a direction of a screw axis of a screw.

19. The electrical device according to claim 18, wherein the lug region behind the lead-in bevel protrudes into the interior space to a lesser extent than in the lug region.

20. The electrical device according to claim 17, wherein each lug region is arranged as a thickening of a wall of the housing part.

21. The electrical device according to claim 17, wherein the tab regions on the frame part are arranged as bent parts that are bent in a direction of a screw axis.

22. The electrical device according to claim 21, wherein the tab regions on the frame are arranged as bent parts that are bent from a plane extending in parallel with a plane having a normal that is parallel to the direction of the screw axis.

23. An electrical device according to claim 9, comprising:
a housing part;
a cover part;
a frame part arranged between the housing part and the cover part;
an electronic circuit arranged in an interior space surrounded by a housing that includes the housing part, the cover part, and the frame part; and
a seal arranged on the frame part;
wherein the seal touches a connection surface of the cover part and provides a seal between the frame part and the cover part;
wherein the seal touches a connection surface of the housing part and provides a seal between the frame part and the housing part;
wherein a region of the connection surface of the cover part touches the frame part;
wherein a region of the connection surface of the housing part touches the frame part;
wherein a screw that extends through the cover part and through the frame part is screwed into a threaded bore arranged in the housing part, a screw head of the screw presses the cover part toward the housing part so that the cover part touches the frame part and the frame part touches the housing part;
wherein the threaded bore is arranged in a thickening of a wall of the housing part; and
wherein the thickening is set apart from lug regions and protrudes into the interior space.

24. An electrical device, comprising:
a housing part;
a cover part;
a frame part arranged between the housing part and the cover part;
an electronic circuit arranged in an interior space surrounded by a housing that includes the housing part, the cover part, and the frame part; and
a seal arranged on the frame part;
wherein the seal touches a connection surface of the cover part and provides a seal between the frame part and the cover part;
wherein the seal touches a connection surface of the housing part and provides a seal between the frame part and the housing part;
wherein a region of the connection surface of the cover part touches the frame part;
wherein a region of the connection surface of the housing part touches the frame part; and
wherein an underside of the housing part includes a recess, the housing part is arranged on a shoulder of a terminal box of an electric motor, and stator lines of a stator of the electric motor are arranged through the recess into the interior space surrounded by the housing.

25. The electrical device according to claim 24, wherein a converter is arranged in the interior space.

26. An electrical device, comprising:
a housing part;
a cover part;
a frame part arranged between the housing part and the cover part;
an electronic circuit arranged in an interior space surrounded by a housing that includes the housing part, the cover part, and the frame part; and
a seal arranged on the frame part;
wherein the seal touches a connection surface of the cover part and provides a seal between the frame part and the cover part;
wherein the seal touches a connection surface of the housing part and provides a seal between the frame part and the housing part;
wherein a region of the connection surface of the cover part touches the frame part;
wherein a region of the connection surface of the housing part touches the frame part; and
wherein, on a side of the frame part facing the cover part, the seal includes a first sealing lip circumferentially arranged on the frame part and elastically deformed more heavily than a rest of a material of the seal on the side of the frame part facing the cover part.

27. The electrical device according to claim 26, wherein, on a side of the frame part facing the housing part, the seal includes a second sealing lip circumferentially arranged on the frame part and elastically deformed more heavily than the rest of the material of the seal on the side of the frame part facing the housing part.

28. The electrical device according to claim 27, wherein the first sealing lip completely surrounds a first screw in a first one of the connection surfaces and provides a seal from the interior space and the external environment, and the second sealing lip completely surrounds a second screw in second one of the connection surfaces provides a seal from the interior space and the external environment.

* * * * *